(12) United States Patent
Yin et al.

(10) Patent No.: US 7,507,110 B1
(45) Date of Patent: Mar. 24, 2009

(54) PROBE CONNECTOR

(75) Inventors: Te-Hung Yin, Taipei Hsien (TW); Yung-Yi Chen, Taipei Hsien (TW)

(73) Assignee: Cheng Uei Precision Industry Co., Ltd., Taipei Hsien (TW)

( * ) Notice: Subject to any disclaimer, the term of this patent is extended or adjusted under 35 U.S.C. 154(b) by 0 days.

(21) Appl. No.: 12/055,042

(22) Filed: Mar. 25, 2008

(51) Int. Cl.
*H01R 11/18* (2006.01)
*H01R 13/24* (2006.01)

(52) U.S. Cl. ........................... 439/482; 439/824
(58) Field of Classification Search .............. 439/824, 439/482; 174/267
See application file for complete search history.

(56) References Cited

U.S. PATENT DOCUMENTS 6,340,320 B1 * 1/2002 Ogawa ...................... 439/824
6,776,624 B2 * 8/2004 Suematsu .................... 439/71
7,126,062 B1 * 10/2006 Vinther et al. .............. 174/267

\* cited by examiner

*Primary Examiner*—Briggitte R Hammond
(74) *Attorney, Agent, or Firm*—WPAT, P.C.; Anthony King

(57) ABSTRACT

A probe connector includes a barrel, a plunger and an elastic element. The barrel disposes a base at one end thereof. The plunger has a basic portion received in the barrel and a contact portion extending out of the barrel from the other end of the barrel opposite to the base. The elastic element is arranged inside the barrel. Two ends of the elastic element are respectively mounted to the basic portion of the plunger and the base and are mounted in a manner such that the two ends of the elastic element are offset and the elastic element is distorted. As the elastic element is distorted inside the barrel, the supporting force provided by the elastic element is not in line with the longitudinal axis of the plunger. The component force of the supporting force provided by the elastic element along the transverse direction is increased, so the plunger is biased to contact the barrel stably.

5 Claims, 4 Drawing Sheets

PROBE CONNECTOR

BACKGROUND OF THE INVENTION

1. Field of the Invention

The present invention relates to a connector, and particularly to a probe connector.

2. The Related Art

A conventional probe connector includes a barrel. A plunger is movably received within the barrel, and one end of the plunger passes through an upper opening of the barrel to contact an outer electric device. A recess is defined at the other end of the plunger. A base is secured in a lower opening of the barrel. A holding cavity coaxially with the recess of the plunger is defined on the top surface of the base. An elastic element is provided inside the barrel and between the plunger and the base. Two ends of the elastic element are respectively mounted to the recess and the holding cavity. Generally, the elastic element resists the plunger for providing a supporting force for the plunger to balance an outer pressure, so that the plunger inclines sideward to contact the inside of the barrel for enabling the probe connector to reach an electrical connection.

However, because the recess of the plunger and the holding cavity of the base which are used for receiving the two ends of the elastic element are arranged coaxially, the elastic element is in a straight state inside the barrel in an original state. When the plunger is pressed down, the force pressed on the plunger is small in transverse direction, so the connection between the barrel and the plunger may be cut off when the probe connector is suffered from shock or the like. In this case the electric current only passes through the elastic element. Because of the high resistance of the elastic element, the electric current passing through the elastic element is small, and the electrical connection of the probe connector is unstable. Moreover, the elastic element produces high temperature when the electric current passing therethrough due to the high resistance of the elastic element, which will lead the probe connector to be burnt down.

SUMMARY OF THE INVENTION

Accordingly, an object of the present invention is to provide a probe connector of stable electrical connection. The probe connector includes a barrel, a plunger and an elastic element. The barrel disposes a base at one end thereof. The plunger has a basic portion received in the barrel and a contact portion extending out of the barrel from the other end of the barrel opposite to the base. The elastic element is arranged inside the barrel. Two ends of the elastic element are respectively mounted to the basic portion of the plunger and the base and are mounted in a manner such that the two ends of the elastic element are offset and the elastic element is distorted.

As described above, because the elastic element is distorted inside the barrel, the supporting force provided by the elastic element is not in line with the longitudinal axis of the plunger. The component force of the supporting force provided by the elastic element along the transverse direction is increased, so the plunger is biased to contact the barrel stably. Thereby the electric connection between the barrel and plunger avoids being cut off when the probe connector is suffered from the shock and the like.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENTS

Figure 1:
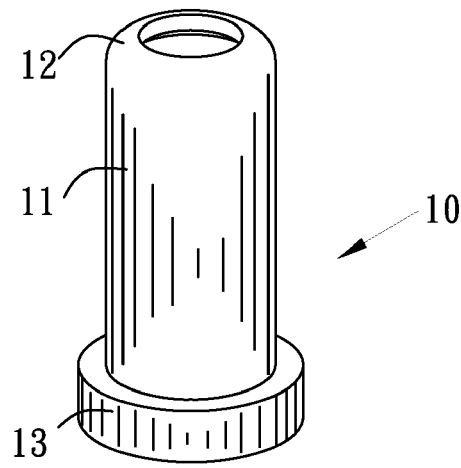
FIG. 1 is an exploded view of a probe connector in accordance with a first embodiment of the present invention.
Figure 1:
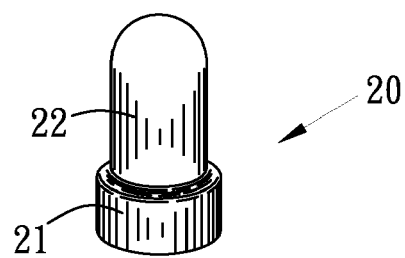
Figure 1:
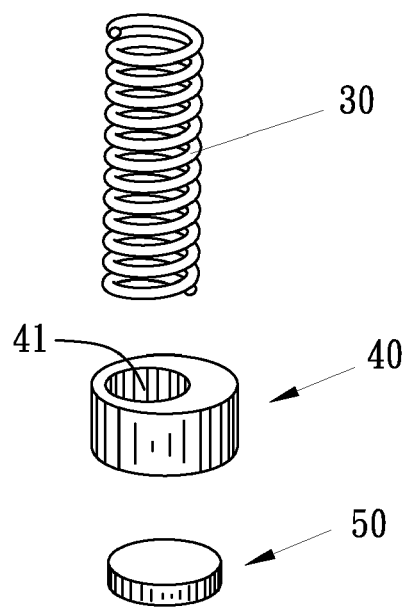
Figure 2:
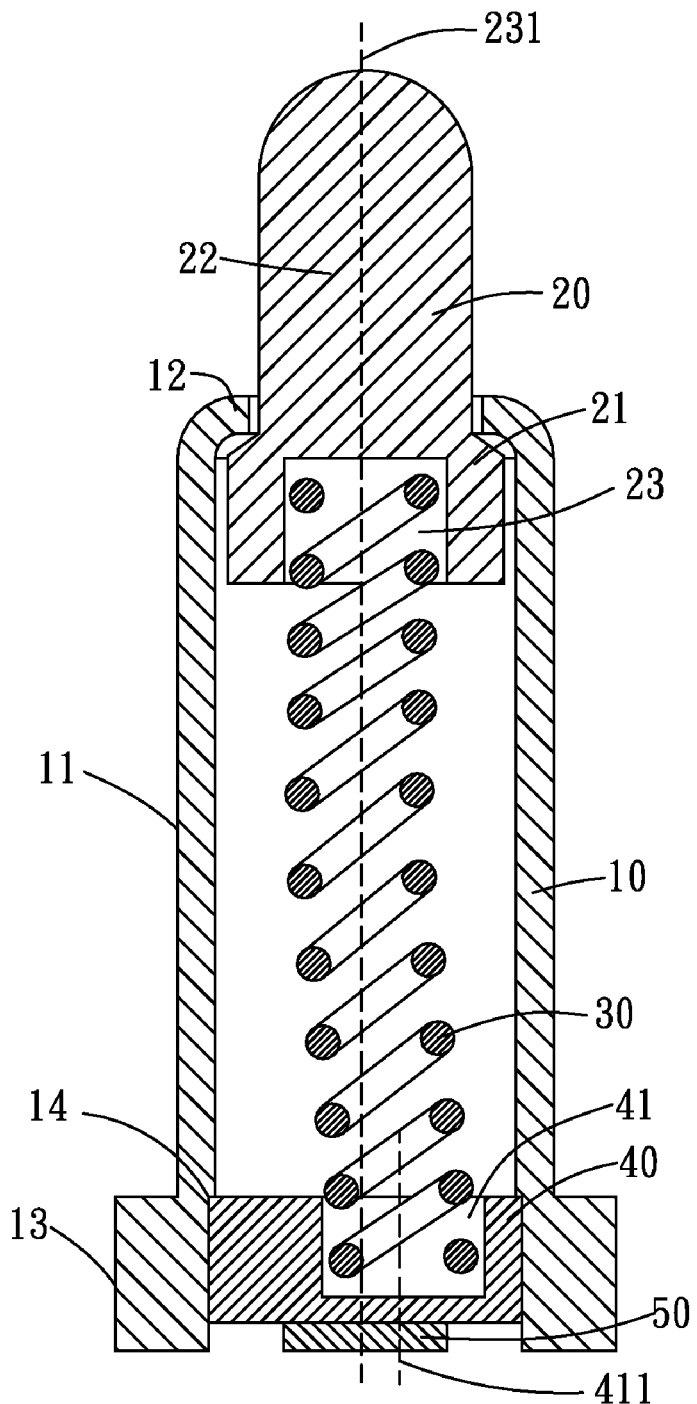
FIG. 2 is a cross-section view of the probe connector shown in FIG. 1.
Figure 3:
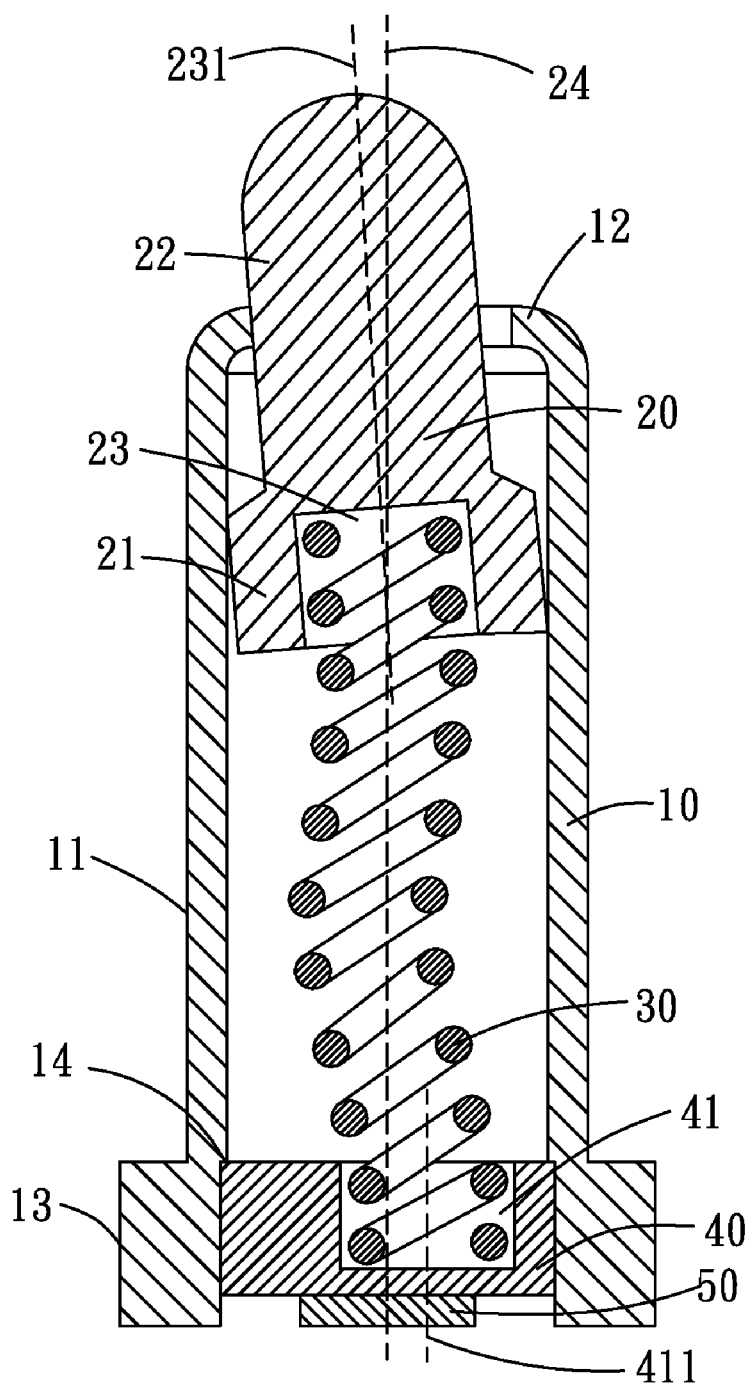
FIG. 3 is a cross-section view of the probe connector for showing a plunger moving inward.

With reference to FIGS. 1-3, a first embodiment of a probe connector in accordance with the present invention is shown. The probe connector includes a hollow barrel 10, a plunger 20, an elastic element 30, a base 40 and a support pad 50. The barrel 10 and the plunger 20 are made from metallic material.

The barrel 10 has a substantially cylindrical main body 11. The main body 11 has a space passing therethrough to define an upper open end and a lower open end. The upper open end of the main body 11 bends inward to form a stopping portion 12 and the lower end of the main body 11 protrudes outward to form a flange 13 along the outer periphery direction of the main body 11. A stair portion 14 is dented on an inner surface of the main body 11.

The plunger 20 includes a basic portion 21 and a contact portion 22 extending from one end of the basic portion 21. The contact portion 22 extends out from the main body 11 through the upper open end of the main body 11. The bottom of the basic portion 21 defines a first recess 23 for receiving one end of the elastic element 30. In the preferred embodiment, the first recess 23 is coaxial with the plunger 20. The outer dimension of the basic portion 21 is less than the inner dimension of the main body 11 for allowing the basic portion 21 movably received within the main body 11 and is more than the inner dimension of the stopping portion 12 for preventing the basic portion 21 removing from the main body 11.

The base 40 secures the lower open end of the main body 11. The stair portion 14 of the barrel 10 prevents the base 40 moving inward. The base 40 is made from plastic material and defines a second recess 41 on an upper surface thereof. The axis 411 of the second recess 41 and the axis 231 of the first recess 23 of the plunger 20 are uncoaxial. In the preferred embodiment, the axis 411 of the second recess 41 is generally parallel to the axis 231 of the first recess 23. The support pad 50 is provided below the base 40 for supporting the base 40.

The elastic element 30 is arranged inside the main body 11 and between the base 40 and the plunger 20. Two ends of the elastic element 30 are mounted to the first recess 23 and the second recess 41. Because the axis 411 of the second recess 41 and the axis 231 of the first recess 23 are uncoaxial, the elastic element 30 is distorted in an original state inside the barrel 10.

Referring to FIG. 3, as the elastic element 30 is distorted in the barrel 10, the supporting force of the elastic element 30 provided for the plunger 20 diverges from the longitudinal axis 24 of the plunger 20. When an outer electrical device (not shown) presses the plunger 20, the plunger 20 moves toward the inside of the main body 11. A component force of the supporting force provided by the elastic element 30 along the longitudinal axis 24 of the plunger 20 counterbalances the pressure provided by the outer electrical device, and a component force of the supporting force along a vertical direction of the longitudinal axis 24 of the plunger 20 leads the plunger 20 to slant and contact an inner wall of the barrel 10. The axis 411 of the second recess 41 separating from the axis 231 of the first recess 23 increases the force along the transverse direction, which ensures that the electrical connection between the barrel 10 and the plunger 20 is stable when the probe connector suffers a shock and the like. The electric current can pass through the plunger 20 and the main body 11 stably.

Figure 4:
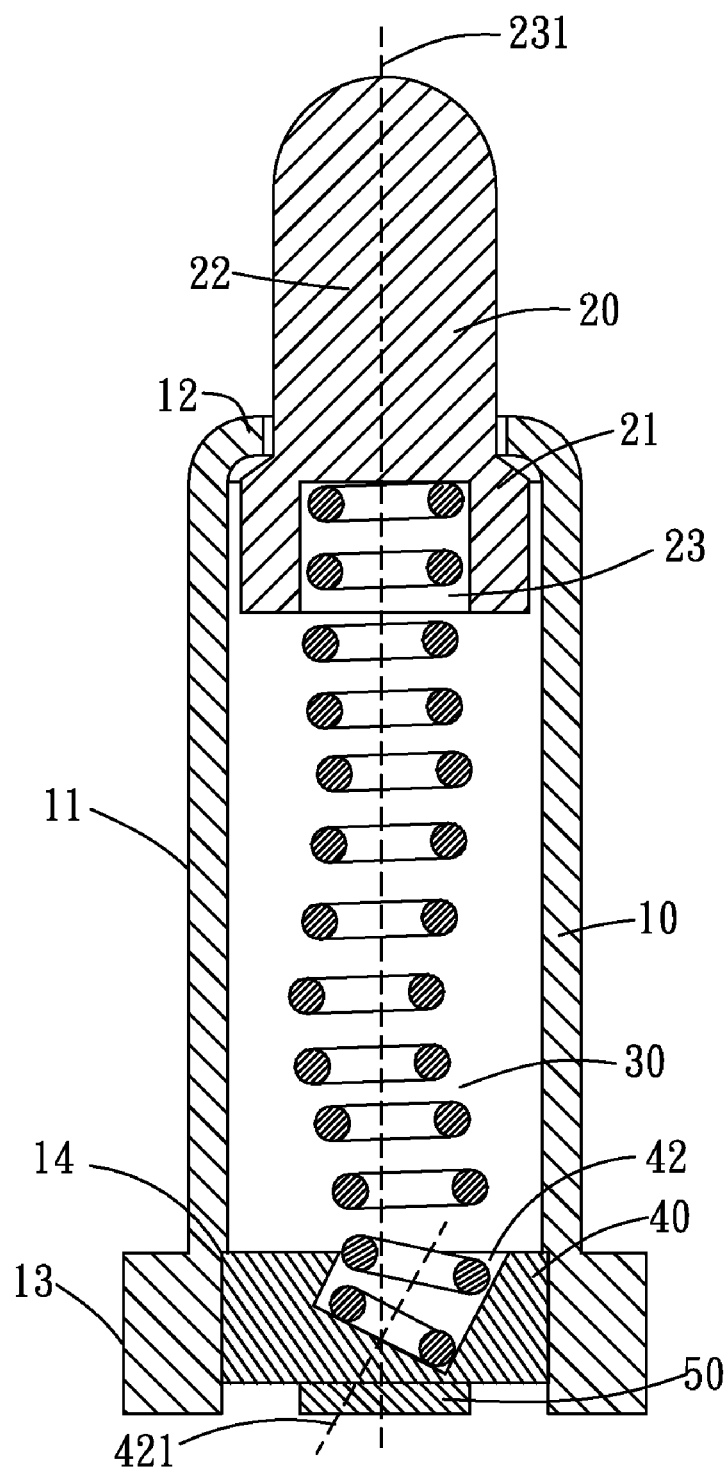
FIG. 4 is a cross-section view a probe connector in accordance with a second embodiment of the present invention.

FIG. 4 illustrates a second embodiment of the present invention. This embodiment is similar to the first embodiment. A base 40 of the second embodiment is substantially the same as the base 40 of the first embodiment shown in FIGS. 1-3. A second recess 42 is opened on the upper surface of the base 40. The axis 421 of the second recess 42 and the axis 231 of first recess 23 cross at acute angle or are un-coplanar.

As described above, because the axis 411 of the second recess 41 or the axis 421 of the second recess 42 and the axis 231 of the first recess 23 are uncoaxial, the elastic element 30 is distorted inside the barrel 10 to provided the plunger 20 an inclined force. So the electrical connection between the barrel 10 and plunger 20 avoids being cut off when the probe connector is suffered from the shock and the like. Otherwise, the base 40 is made from plastic material, thereby the electric current does not pass through the elastic element 30 through the base 40. So in the present invention the elastic element 30 avoids producing high temperature in use.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A probe connector, comprising:
   a barrel disposing a base at one end thereof;
   a plunger having a basic portion received in the barrel and a contact portion extending out of the barrel from the other end of the barrel opposite to the base;
   an elastic element arranged inside the barrel, two ends of the elastic element being respectively mounted to the basic portion of the plunger and the base and being mounted in a manner such that the two ends of the elastic element are offset and the elastic element is distorted; and
   wherein the basic portion of the plunger and the base respectively define a recess for mounting the elastic element, and the recesses of the plunger and the base are uncoaxial.

2. The probe connector as claimed in claim 1, wherein the axes of the recesses of the base and the plunger are parallel to each other.

3. The probe connector as claimed in claim 1, wherein the axes of the recesses of the base and the plunger cross at acute angle or are un-coplanar.

4. The probe connector as claimed in claim 1, wherein the base is made from plastic material.

5. The probe connector as claimed in claim 1, further comprising a support pad disposed on the bottom of the base for supporting the base.

\* \* \* \* \*